United States Patent [19]
Kang et al.

[11] Patent Number: 5,827,986
[45] Date of Patent: Oct. 27, 1998

[54] APPARATUS FOR CLEANING SEMICONDUCTOR WAFERS

[75] Inventors: Tae-Chel Kang; Chang-Yong Jung, both of Soowon, Rep. of Korea

[73] Assignee: Samsung Electronics Co., Ltd., Suwon, Rep. of Korea

[21] Appl. No.: 868,831

[22] Filed: Jun. 9, 1997

[30] Foreign Application Priority Data

Jun. 8, 1996 [KR] Rep. of Korea ........................ 96-20494

[51] Int. Cl.⁶ .................................................. G01R 35/00
[52] U.S. Cl. .......................................................... 73/866.5
[58] Field of Search ........................... 134/113; 73/865.8, 73/865.9, 324, 325, 431, 866.5

[56] References Cited

U.S. PATENT DOCUMENTS

| | | | |
|---|---|---|---|
| 3,467,113 | 9/1969 | Jacobsen et al. | 134/113 |
| 4,541,277 | 9/1985 | Starnes, Jr. | 73/324 |
| 4,757,255 | 7/1988 | Margozzi | 324/760 |
| 4,872,356 | 10/1989 | Barnett et al. | 73/866.5 |
| 5,199,308 | 4/1993 | Lawhon et al. | 73/866.5 |

FOREIGN PATENT DOCUMENTS 0125615 10/1981 Japan ........................................ 73/431

*Primary Examiner*—Robert Raevis
*Attorney, Agent, or Firm*—Jones & Volentine, L.L.P.

[57] ABSTRACT

A semiconductor wafer cleaning apparatus is provided with a bracket having an improved housing structure. The housing is provided to support a sensor that can stably detect when wafers are placed in each cleaning bath. The sensor is generally in two parts, a photodiode for emitting a beam of light, and a photodetector for detecting the beam of light. A sensor supporting member receives the sensor and includes a cover, one or more side walls, a bottom part, and a plurality of projections formed on the bottom part. The bottom part has a through-hole and is spaced from an outer surface of the process vessel to form a first space between the bottom part and the process vessel. The plurality or are spaced to form a second space between the sensor and the bottom part of the sensor supporting member. A gas introducing section introduces a water vapor eliminating gas into the second space. The gas introduced into the second space flows through the through-hole into the first space. Any water vapor that covers either the photosensor or the outer surface of the process vessel is removed so that a light beam emitted from the photodiode can reach to the phototransistor.

13 Claims, 3 Drawing Sheets

APPARATUS FOR CLEANING SEMICONDUCTOR WAFERS

BACKGROUND OF THE INVENTION

The present invention relates to a wafer cleaning apparatus used to fabricate a semiconductor device. More particularly the present invention relates to a wafer cleaning apparatus with an improved sensor supporting structure capable of stablely detecting whether wafers are placed in each cleaning bath.

With a recent increase in integration of semiconductor devices, even extremely small particles can exert an undesired influence on the electrical characteristics of a semiconductor device. As a result, a cleaning technique that is used to remove such contaminant particles plays an increasingly important role in the fabrication of semiconductor devices. In this cleaning technique, several sorts of cleaning solutions are selectively used in accordance with the kinds of contaminants that must be removed from a wafer.

As shown in FIG. 1, a conventional wafer cleaning apparatus includes an external vessel 110, a plurality of internal (or process) vessels 111 to 114, a drying station 130, and a robot transfer arm 140. The plurality of internal vessels 111 to 114 are successively arranged inside the external vessel 110. The internal vessels 111 to 114 correspond to first washing, first rinsing, second washing and second rinsing stations, respectively. Each of the internal vessels 111 to 114 contains either a cleaning solution or a rinsing solution and has an individual closable enclosure. The drying station 130 dries the cleaned wafers. The robot transfer arm 140 loads the wafers in the washing vessel 111, transports them from one station to another station, and unloads them from the rinsing vessel 114. The robot arm 140 moves the wafers progressively through the first washing and rinsing vessels 111 and 112 and the second washing and rinsing vessels 113 and 114. Generally multiple wafers are transported through this process at a single time within a wafer cassette.

After a number of wafers positioned in the vertical plane of a wafer cassette (not shown) are dipped into the cleaning solution in the appropriate washing vessel 111 or 113, and are washed, the wafers are lifted from the washing vessel 111 or 113 and are transported by the transfer robot transfer arm 140 to the proper drying station 112 or 114. When the wafers are lifted from one of the washing vessels 111 or 113, the cleaning solution, including unwanted particles, may adhere to the wafers as well as to the wafer cassette. Consequently, after washing the cleaning solution itself can serve as a contaminant. Accordingly, after washing the wafers must be rinsed at a rinsing station 112 or 114 using a rinsing solution, e.g., deionized water.

In case of the above cleaning apparatus, the use of different kinds of cleaning solutions results in an increase in the number of washing and rinsing stations required. It also increases the number of transfers within the apparatus for each wafer. As a result of all this, conventional wafer cleaning apparatuses have very complicated constructions.

Recently, a cleaning process has been used that does not involve a wafer cassette, but rather automatically transports the wafers individually using a robot transfer arm. This allows the cleaning of large diameter semiconductor wafers and improves the productivity of the manufacturing process. This cleaning technique requires accurate positioning of wafers in the individual process vessels, however. A conventional technique for accurately positioning the wafer is accomplished by detecting whether a wafer is accurately positioned in the respectively process vessel and controlling a wafer transfer robot in response to the detected signal.

FIG. 2 shows a process vessel on which a photosensor assembly for detecting a wafer position is installed. As shown in FIG. 2, the process vessel 111 is installed in an external vessel 110 and is used to wash a wafer 400. When a cleaning solution included in the process vessel 111 overflows from the process vessel 111, the overflowed solution is received in the external vessel 110 and exhausted through a drain line 300 installed at the bottom of the external vessel 110 to a separate drain tank (not shown). A pair of photosensor elements 200 are located on opposing surfaces of the process vessel 111. One of the photosensor elements 200 includes a photodiode 200a for emitting a light beam. The other photosensor element 200 includes a phototransistor 200b for receiving the light beam and converting it into an electrical signal.

The photosensor elements 200 are each inserted into a bracket 210 and secured on an outer wall of the process vessel 111 by a screw 211 passing through the bracket 210, which is attached to the outer wall of the process vessel 111. Detection of the wafer 400 in the process vessel 111 is accomplished by the opposed photosensor elements 200a and 200b which are adhered on both outer walls of the process vessel 111.

In the conventional wafer cleaning apparatus with the structure described above, the process vessel 111 is provided with the bracket 210 having an opening on its lower side. The photosensor 200 is inserted through the opening into the bracket 210. However, even though the photosensor 200 is adhered to the process vessel 111, a fine gap forms between the photosensor 200 and the wall of the process vessel 111. Water vapor can penetrate into this gap and can cover the photosensor 200. If the photosensor 200 is sufficiently covered with the water vapor, a light beam emitted from the photodiode 200a cannot reached the phototransistor 200b, and the photosensor 200 fails to operate properly.

The water vapor can be produced when the cleaning solution is introduced into the bracket 210, or when a hot cleaning solution is mixed with a relatively low temperature cleaning solution in the process vessel 111.

As described immediately above, if the photosensor 200 fails to operate properly because of the penetration of water vapor into the bracket 210, then the photosensor 200 will not properly detect whether a wafer is located in the process vessel 111. The wafer that was previously contained in the process vessel 111 may then be broken by a new wafer transported by the transfer robot, since there is no accurate information as to where the wafers currently are. As a result, a normal cleaning process cannot continue to be performed.

Furthermore, the rapid change of temperature during the cleaning process can shorten the life of the photosensor 200. Rapid changes in temperature can lead to the generation of water vapor. This water vapor can penetrate into the interface surface between the process vessel 111 and the photosensor 200, thus lowering the sensitivity of the photosensor 200. This undesired phenomena described above may give rise to wafer transfer error during the cleaning process, resulting in reduction of work efficiency and production.

SUMMARY OF THE INVENTION

It is therefore an object of the present invention to provide a wafer cleaning apparatus capable of accurately detecting whether a wafer is positioned in a process vessel.

It is another object of the present invention to provide a wafer cleaning apparatus capable of prolonging the life of a photosensor, which is used to detect whether a wafer is located in a process vessel.

According to an aspect of the present invention, a semiconductor wafer cleaning apparatus has successively arranged process vessels for washing, rinsing and drying wafers. The apparatus comprises a bracket provided with a process vessel and having an opening; a sensor inserted into the bracket through the opening, for detecting whether a wafer is located in the process vessel; a sensor receiving section having a cover, a plurality of projections, both side walls and a bottom part, for receiving the sensor, the bottom part having a through-hole and being spaced from an outer surface of the process vessel to form a first space between the bottom part and the process vessel, and the projections being spaced from the bottom part to form a second space between the bottom part and the sensor; a gas introducing section for introducing a water vapor eliminating gas into the second space; and a fixing member for fixedly holding the sensor. With this construction, since the first space is in communication with the second space through the through hole of the bottom part, the water vapor covered on the photosensor and an outer surface of the process vessel is removed so that a light beam emitted from a photodiode can be reached to a phototransistor.

The water vapor eliminating gas comprises a nitrogen gas, and the fixing member comprises a screw passing through the bracket and pushing the cover. Also, the sensor comprise a photocoupler.

According to another aspect of the present invention, a semiconductor wafer cleaning apparatus comprises a bracket provided with a process vessel and having an opening; a sensor inserted into the bracket through the opening, for detecting whether a wafer is located in the process vessel; a supporting means for fixedly supporting the sensor, the means having a first space formed between the means and the process vessel; and means for eliminating a water vapor between the supporting means and the vessel. The water vapor eliminating means comprises a second space formed between the supporting means and the sensor inserted therein, and a gas introducing port for introducing a vapor eliminating gas into the second space, and wherein the first space is in communication with the second space.

BRIEF DESCRIPTION OF THE DRAWINGS

This invention may be fully understood and its object will become apparent to those skilled in the art by reference to the accompanying drawings as follows.

DETAILED DESCRIPTION OF THE PREFERRED EMBODIMENT OF THE PRESENT INVENTION

Figure 3:
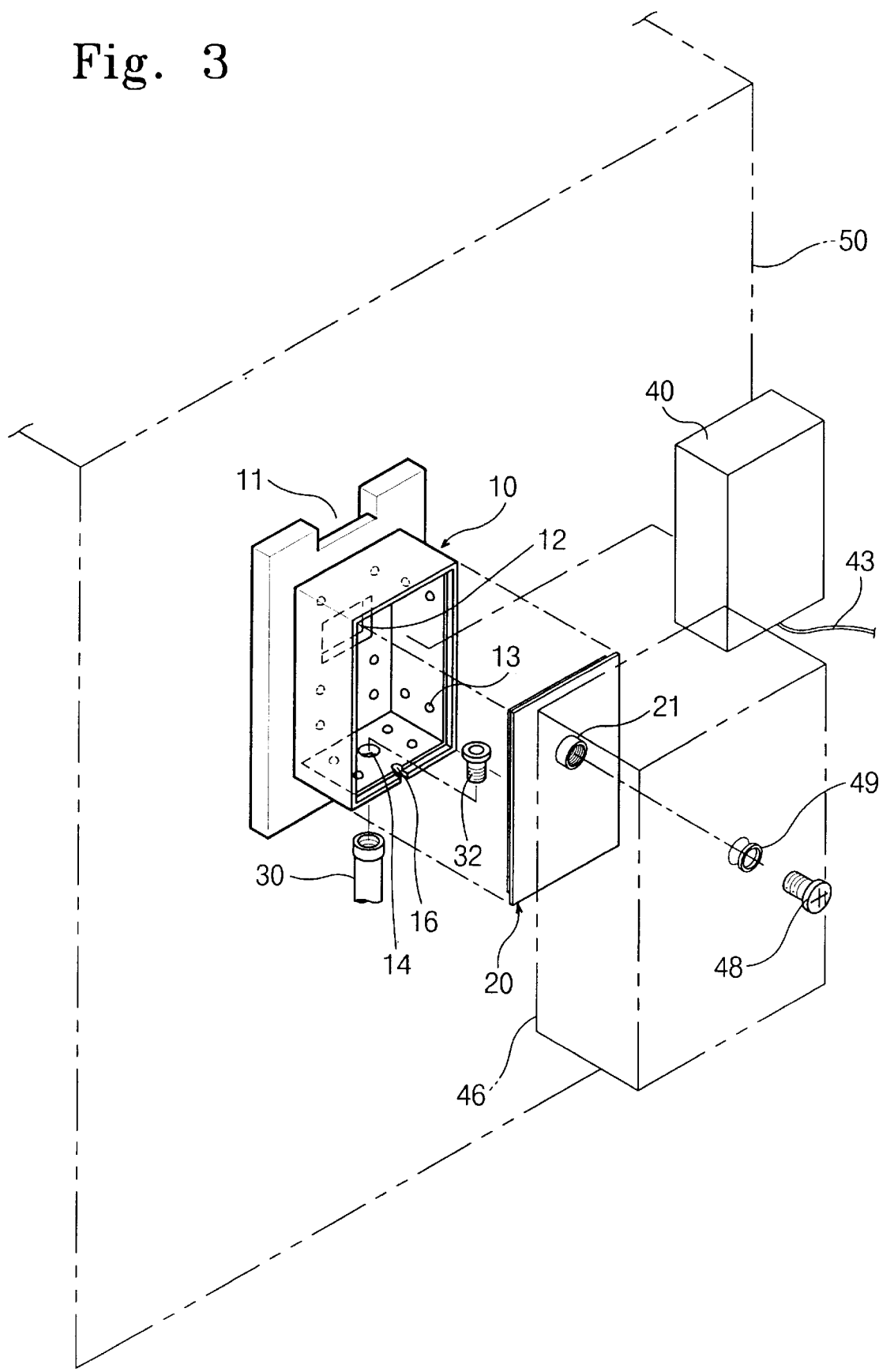
FIG. 3 is an exploded view showing a sensor assembly that is inserted into a novel bracket on a process vessel according to a preferred embodiment of the present invention.
Figure 4:
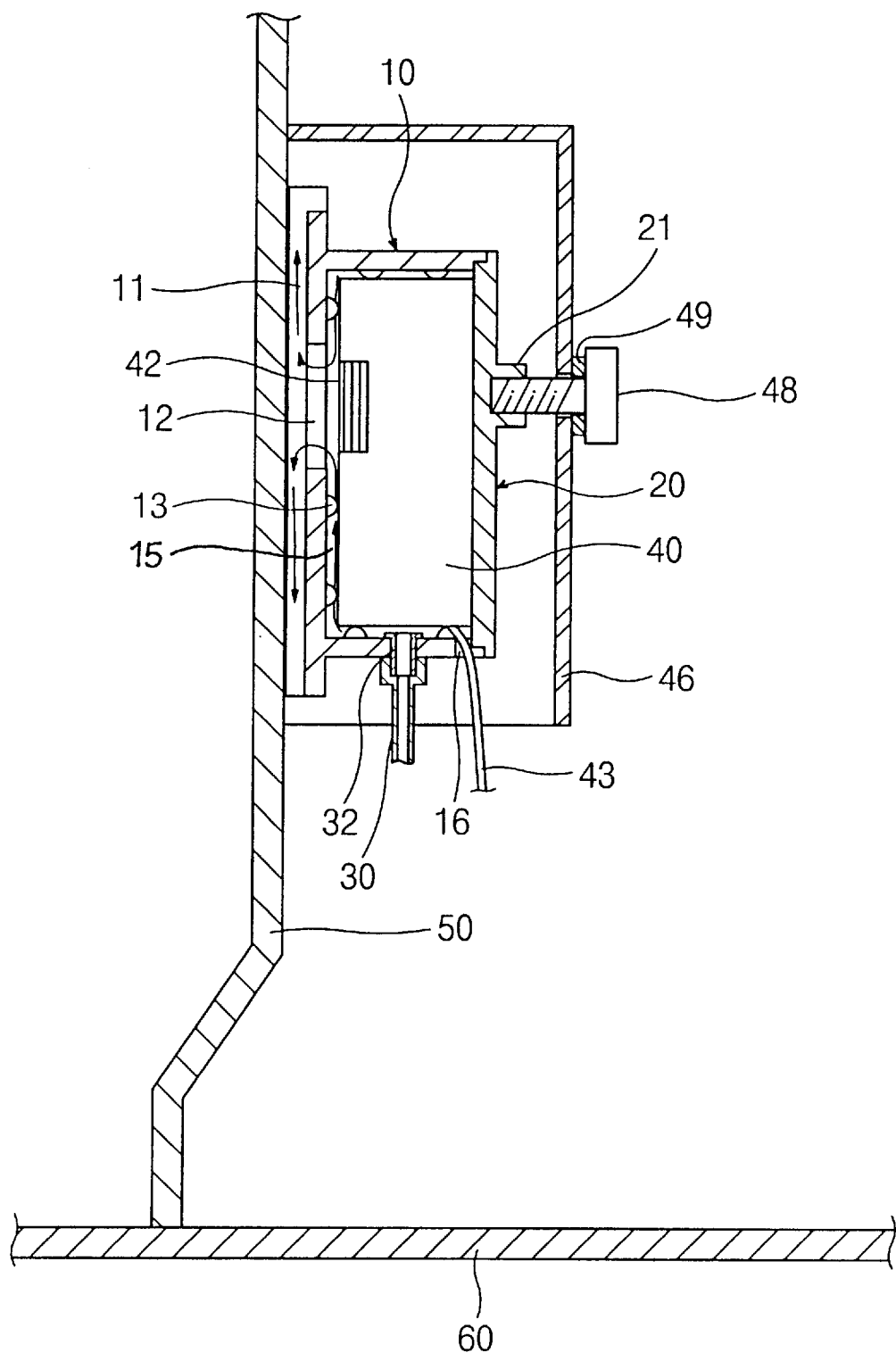
FIG. 4 is a cross-sectional view showing the combination of the sensor assembly with the novel bracket according to a preferred embodiment of the present invention.

FIGS. 3 and 4 illustrate a novel semiconductor wafer cleaning apparatus having successively arranged process vessels for washing, rinsing and drying wafers according to a preferred embodiment the present invention. The wafer cleaning apparatus comprises a housing 10, a cover 20, a gas supply line 30, a sensor assembly 40, a bracket 46, and a process vessel 50.

Figure 1:
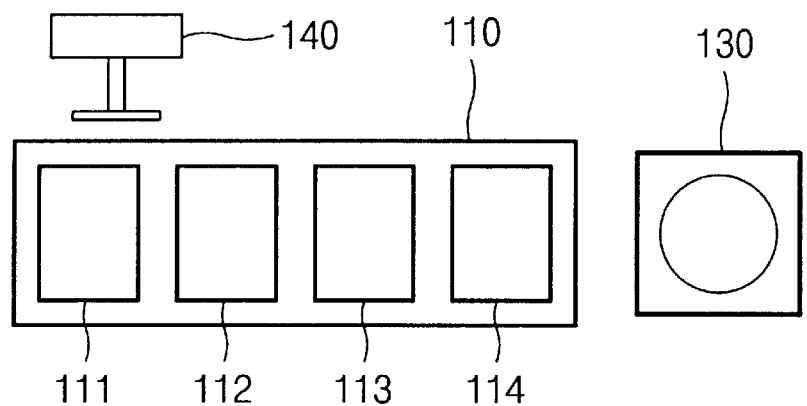
FIG. 1 is a schematic diagram showing a conventional wafer cleaning apparatus.
Figure 2:
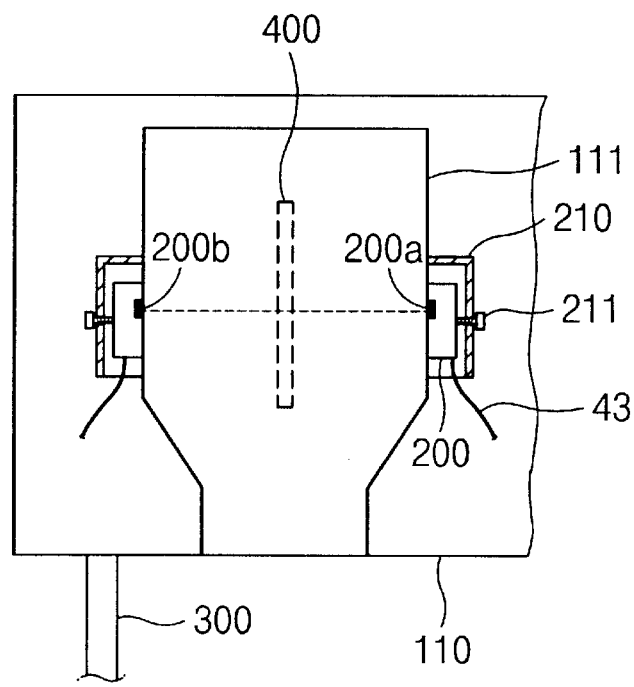
FIG. 2 is a cross-sectional view showing the process vessel of FIG. 1 on which a sensor assembly for detecting wafer position is installed.

The sensor assembly 40 detects whether a wafer is located in a process vessel 50. The housing 10 fixedly supports the sensor assembly 40 and a water vapor eliminating member for eliminating a water vapor between the housing 10 and the vessel 50. The water vapor eliminating member comprises a plurality of projections 13 extending from the inside walls of the housing 10 to form a first space 15. The sensor assembly 40 is placed in a bracket 46 that is provided with the process vessel 50. The process vessel 50 is itself placed in the external vessel 60 Reference numeral 60 indicates an external vessel as in the vessel 110 of FIG. 1.

Each sensor assembly 40 includes a sensor element 42. This sensor element 42 can be either a phototransistor or a photodiode. The wafer cleaning apparatus uses one of each of these sensor assemblies opposite sides of each vessel 50. One sensor assembly 40 contains a photodiode to transmit a signal; the other sensor assembly 40 contains a phototransistor to detect the signal. Aside from the difference in the type of sensor element 42, however, the orientation of the sensor assembly to other elements is identical.

Referring again to FIG. 3, the sensor assembly 40 is inserted through an opening (not shown) at the lower part of the bracket 46 and is placed into the bracket 46. Once in place, the sensor assembly 40 detects whether a wafer is located in the process vessel 50. The housing 10 receives the sensor assembly 40 and fixedly holds it. A plurality of projections 13 are preferably formed on the bottom and on the side walls of the housing 10. These projections 13 push the sensor assembly 40 away from the housing 10 to form a first space 15 between the sensor assembly 40 and the housing 10. A connecting tube line 32 is preferably formed at one of the side walls of the housing 10. The connecting tube 32 passes through the side wall and is connected to a gas supply line 30 through which a vapor-eliminating gas, such as nitrogen ($N_2$) or the like, is introduced into the first space 15. The bottom part of the housing 10 (i.e., the part of the housing 10 facing the process vessel 50) has a through-hole 12 formed in it. The through-hole 12 opens up into a second space 11 that is formed between the bottom part of the housing 10 and the process vessel 50. The second space 11 is in communication with the first space 15 by means of the through-hole 12.

The vapor-eliminating gas is introduced through the gas supply line 30 into the first space 15 and then passes through the through-hole 12 to the second space 11 between the process vessel 50 and the bottom part of the housing 10. The vapor-eliminating gas is then exhausted from the second space 11 to an area outside the assembly. As the vapor-eliminating gas is exhausted from the second space, it takes excess water vapor with it and thus dries out both the first and second spaces 15 and 11.

A cover is preferably fixed onto the housing 10, preferably by a screw 48 or similar fixing member. The screw 48 preferably passes through the bracket 46 and presses onto a post 21 on the cover 20. A washer 49 can be placed in between the screw and the bracket to increase the contact area between the bracket 46 and the screw 48. The screw 48 also preferably pushes the sensor assembly 40 in the direction of the bottom part of the housing 10 to be fixed held.

A signal line 43 passes through a hole 16 in the housing 10 and connects to the sensor assembly 40. When the sensor element 42 is a photodiode, the signal line 43 applies a sensor driving voltage from a controller (not shown) to the sensor element 42 of the sensor assembly 40. When the sensor element 42 is a phototransistor, the signal line 43 receives a detection signal from a sensor element 42 and passes the detection signal to the controller (not shown). The detection signal is a signal indicating whether the wafer is located in the process vessel 50.

Any water vapor that covers the sensor element 42 or the outer surface of the process vessel 50 is removed by allowing the vapor eliminating gas to flow within the space between he process vessel 50 sensor assembly 40. With the elimination of water vapor from the sensor element 42 and the outer surface of the process vessel 50, a light beam emitted from the photodiode sensor element 42 can reach the phototransistor sensor element 42 without interference.

As described above, a semiconductor wafer cleaning apparatus according to the preferred embodiment of the present invention is capable of removing water vapor that covers both an outer surface of a process vessel and a photosensor during a cleaning process. As a result, this apparatus can accurately detect whether a wafer is positioned in the process vessel.

Furthermore, the wafer cleaning apparatus is capable of prolonging the life of the photosensor. The supply of a vapor eliminating gas into a space between the process vessel 50 and the sensor element 42 during the cleaning process prevents a rapid change of temperature around the photosensor. Such rapid changes in temperature would lessen the life of the sensor element 42.

While a preferred embodiment of the present invention has been described above, it is understood by those skilled in the art that various changes and modifications may be made without departing from the scope of the present invention. Therefore, it is intended that the present invention not be limited to the particular embodiment disclosed as the best mode contemplated for carrying out the present invention, but that the present invention includes all embodiments falling within the scope of the appended claims.

What is claimed is:

1. A semiconductor wafer detecting device for a wafer cleaning apparatus having successively arranged process vessels for washing, rinsing, and drying wafers, the detecting device comprising:

a pair of brackets on each process vessel, one bracket provided on opposite sides of each process vessel, each bracket having an opening;

a sensor, inserted into each bracket through its respective opening, for detecting whether a wafer is located in the respective process vessel;

a sensor housing disposed inside each bracket for receiving the sensor, the sensor housing being spaced from an outer surface of the process vessel to form a first space between the sensor housing and the process vessels, into which first space a water vapor eliminating gas is introduced; and a fixing member for fixedly holding the sensor housing inside the bracket.

2. A semiconductor wafer detecting device, as recited in claim 1, wherein the sensor housing further comprises:

a cover;

one or more side walls;

a bottom part proximal to the outer surface of the process vessel, the bottom part having a plurality of projections extending toward the sensor, wherein the plurality of projections form a second space between the bottom part of the sensor housing and the sensor, into which second space the water vapor eliminating gas is introduced.

3. A semiconductor wafer detecting device, as recited in claim 2, wherein the first space is in communication with the second space through a through hole in the bottom part of the sensor housing.

4. A semiconductor wafer detecting device, as recited in claim 1, wherein the water vapor eliminating gas comprises nitrogen gas.

5. A semiconductor wafer detecting device, as recited in claim 2, wherein the fixing member comprises a screw passing through the bracket and pushing against the cover of the sensor housing.

6. A semiconductor wafer detecting device, as recited in claim 1, wherein the sensor comprises a photocoupler.

7. A semiconductor wafer detecting device, as recited in claim 1, further comprising a connecting tube line that passes through a side wall of the sensor housing, the connecting tube connected to a gas supply line.

8. A semiconductor wafer detecting device, as recited in claim 1, wherein one of the sensors is a phototransistor and the other sensor is a photodiode.

9. A wafer detector for a semiconductor wafer cleaning apparatus having successively arranged process vessels for washing, rinsing, and drying wafers, the detecting device comprising:

a pair of brackets on each process vessel, one bracket placed on opposite sides of each process vessel, each bracket having an opening;

a sensor, inserted into each bracket through its respective opening, for detecting whether a wafer is located in the respective process vessel;

a supporting means for fixedly supporting the sensor, the supporting means having a first space formed between the supporting means and the process vessel; and a water vapor eliminating means for eliminating water vapor between the supporting means and the vessel.

10. A wafer detector as recited in claim 9, wherein the water vapor eliminating means further comprises:

a second space formed between the supporting means and the sensor, the second space being connected to the first space; and a gas introducing device for introducing a vapor eliminating gas into the second space.

11. A semiconductor wafer detecting device for a wafer cleaning apparatus having successively arranged process vessels for washing, rinsing, and drying wafers, the detecting device comprising:

a pair of brackets on each process vessel, one bracket provided on opposite sides of each process vessel, each bracket having an opening;

a sensor housing disposed inside each bracket;

a pair of sensors for detecting whether a wafer is located in the respective process vessel, one sensor being disposed inside each sensor housing, so that a space is created between each sensor and the outside wall of the vessel, into which space a water vapor eliminating gas is introduced.

12. A semiconductor wafer detecting device, as recited in claim 11, wherein the space comprises a first space region between the sensor housing and the process vessel, and a second space region between the sensor housing and the sensor, the second space region in flow communication with the first space region.

13. A semiconductor wafer detecting device, as recited in claim 11, wherein one of the sensors is a phototransistor and the other sensor is a photodiode.

* * * * *